(12) United States Patent
Bruel (10) Patent No.: US 8,062,564 B2
(45) Date of Patent: Nov. 22, 2011

(54) METHOD OF PRODUCING A PLATE-SHAPED STRUCTURE, IN PARTICULAR, FROM SILICON, USE OF SAID METHOD AND PLATE-SHAPED STRUCTURE THUS PRODUCED, IN PARTICULAR FROM SILICON

(75) Inventor: Michel Bruel, Veurey Voroize (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 735 days.

(21) Appl. No.: 10/574,120

(22) PCT Filed: Sep. 23, 2004

(86) PCT No.: PCT/FR2004/002398
§ 371 (c)(1),
(2), (4) Date: May 31, 2007

(87) PCT Pub. No.: WO2005/034218
PCT Pub. Date: Apr. 14, 2005

(65) Prior Publication Data
US 2008/0038564 A1  Feb. 14, 2008

(30) Foreign Application Priority Data
Sep. 30, 2003 (FR) ..................... 03 11450

(51) Int. Cl.
*B29C 44/34* (2006.01)
*B29C 65/00* (2006.01)
*H01L 21/30* (2006.01)
*B32B 37/00* (2006.01)
*H01L 21/46* (2006.01)

(52) U.S. Cl. ............ 264/51; 264/41; 264/345; 264/346; 438/455; 438/458; 156/249

(58) Field of Classification Search ................ 264/41, 264/51, 345, 346; 438/458, 455; 156/249
See application file for complete search history.

(56) References Cited

U.S. PATENT DOCUMENTS

| 4,979,015 | A | * | 12/1990 | Stierman et al. | 257/778 |
| 5,817,368 | A | * | 10/1998 | Hashimoto | 427/255.38 |
| 5,854,123 | A | * | 12/1998 | Sato et al. | 438/507 |
| 5,888,297 | A | * | 3/1999 | Ogura | 117/94 |

(Continued)

FOREIGN PATENT DOCUMENTS
JP          09-162090      6/1997
(Continued)

*Primary Examiner* — Christina Johnson
*Assistant Examiner* — Atul P Khare
(74) *Attorney, Agent, or Firm* — Winston & Strawn LLP (57) ABSTRACT

Method for fabricating a structure in the form of a plate, and structure in the form of a plate, in particular formed from silicon, including at least one substrate, a superstrate and at least one intermediate layer interposed between the substrate and the superstrate, in which the intermediate layer comprises at least one base material having distributed therein atoms or molecules termed extrinsic atoms or molecules which differ from the atoms or molecules of the base material, and in which a heat treatment is applied to said plate so that, in the temperature range of said heat treatment, the intermediate layer is plastically deformable and the presence of the selected extrinsic atoms or molecules in the selected base material causes the irreversible formation of micro-bubbles or micro-cavities in the intermediate layer.

20 Claims, 6 Drawing Sheets

U.S. PATENT DOCUMENTS

| | | | |
|---|---|---|---|
| 6,127,285 A | 10/2000 | Nag | |
| 6,303,468 B1 * | 10/2001 | Aspar et al. | 438/455 |
| 6,352,909 B1 * | 3/2002 | Usenko | 438/458 |
| 6,417,075 B1 * | 7/2002 | Haberger et al. | 438/459 |
| 6,426,270 B1 * | 7/2002 | Sakaguchi et al. | 438/406 |
| 6,465,327 B1 | 10/2002 | Lagahe et al. | |
| 6,756,286 B1 * | 6/2004 | Moriceau et al. | 438/459 |
| 6,759,310 B2 * | 7/2004 | Tayanaka | 438/458 |
| 6,774,010 B2 * | 8/2004 | Chu et al. | 438/458 |
| 6,809,044 B1 | 10/2004 | Aspar et al. | |
| 7,713,369 B2 * | 5/2010 | Aspar et al. | 156/249 |
| 2002/0048844 A1 * | 4/2002 | Sakaguchi | 438/106 |

FOREIGN PATENT DOCUMENTS

| | | |
|---|---|---|
| JP | 11-233449 | 8/1999 |
| JP | 2001-507525 | 6/2001 |
| JP | 2002-016239 | 1/2002 |
| JP | 2002-134375 | 5/2002 |
| JP | 2002-519847 | 7/2002 |
| JP | 2004-535664 | 11/2004 |
| KR | 2004057636 A * | 7/2004 |
| WO | WO 99/35674 | 7/1999 |
| WO | WO 9935674 A1 * | 7/1999 |
| WO | WO 02/084721 | 10/2002 |

* cited by examiner

METHOD OF PRODUCING A PLATE-SHAPED STRUCTURE, IN PARTICULAR, FROM SILICON, USE OF SAID METHOD AND PLATE-SHAPED STRUCTURE THUS PRODUCED, IN PARTICULAR FROM SILICON

BACKGROUND OF THE INVENTION

1. Field of the Invention

The present invention relates to the field of fabricating multi-layered plates, and to fabricating thin wafers.

2. Description of the Relevant Art

In the microtechnology field, in particular in micro-electronics and opto-electronics, it is normal to use silicon wafers joined to an insulating layer, and more particularly structures comprising an insulating layer interposed between a substrate formed from silicon and a superstrate formed from silicon.

SUMMARY OF THE INVENTION

The disclosed embodiments aim to improve current techniques and structures, thereby improving performance and diversifying applications.

One embodiment concerns a method for fabricating a structure in the form of a plate including at least one substrate, a superstrate and at least one intermediate layer interposed between the substrate and the superstrate.

According to an embodiment, the method includes selecting an intermediate layer including at least one base material having distributed therein atoms or molecules termed extrinsic atoms or molecules which differ from the atoms or molecules of the base material, and applying a heat treatment to said structure so that, in the temperature range of said heat treatment, the intermediate layer is plastically deformable, and the presence of the selected extrinsic atoms or molecules in the selected base material causes the irreversible formation of micro-bubbles or micro-cavities in the intermediate layer.

According to an embodiment, the heat treatment preferably produces micro-bubbles or micro-cavities which weaken said intermediate layer.

According to an embodiment, the heat treatment preferably produces a rupture of said intermediate layer and, as a result, separation of the substrate and the superstrate.

Another embodiment provides a method for separating the substrate and superstrate in the structure obtained by the above method.

In an alternate embodiment, said separation method may include applying forces between the substrate and the superstrate to bring about the rupture of the intermediate layer between the substrate and the superstrate due to the presence of said micro-bubbles or micro-cavities.

In a further embodiment, said separation method may include chemically attacking the intermediate layer to at least partially remove said intermediate layer between the substrate and the superstrate due to the presence of said micro-bubbles or micro-cavities.

According to an embodiment, the substrate and the superstrate may advantageously be formed from monocrystalline silicon and the intermediate layer may advantageously be formed from doped silica.

Another embodiment concerns a method for fabricating silicon wafers which includes producing a structure in the form of a plate including a substrate formed from silicon, a superstrate formed from silicon and a dielectric intermediate layer including at least one base material having distributed therein atoms or molecules termed extrinsic atoms or molecules which differ from the atoms or molecules of the base material; then applying a heat treatment to said structure so that, in the temperature range of the heat treatment, the intermediate layer is plastically deformable and so that the presence of the selected extrinsic atoms or molecules in the selected base material causes the irreversible formation of micro-bubbles or micro-cavities in the intermediate layer.

In an embodiment, said base material is preferably silica and the extrinsic atoms are preferably atoms of phosphorus and/or boron, thus forming an intermediate layer of phospho-silicate glass (P.S.G.), boro-silicate glass (B.S.G.), or boro-phospho-silicate glass (B.P.S.G.).

In an embodiment, the concentration of phosphorus may advantageously be in the range from 6% to 14%.

In an embodiment, the concentration of boron may advantageously be in the range from 0% to 4%.

In an embodiment, the heat treatment is preferably carried out at a temperature in the range from 900° C. to 1200° C.

In an embodiment, the method may include, prior to said heat treatment, carrying out an operation for depositing said intermediate layer on the substrate, or respectively the superstrate, and attaching the superstrate, or respectively the substrate, to said intermediate layer by molecular wafer bonding.

In an embodiment, the method may advantageously include a supplemental step for reducing the thickness of the substrate.

In an embodiment, on said intermediate layer side, the substrate and the superstrate may advantageously respectively include a thermal silicon oxide.

In accordance with an alternate embodiment, the method may include exerting forces on said structure in a manner such that rupture of said intermediate layer is brought about, resulting in separation of the substrate and superstrate due to the presence of said micro-bubbles or micro-cavities to obtain a wafer constituted by the substrate and/or a wafer constituted by the superstrate.

In accordance with another embodiment, the method may include chemically attacking said intermediate layer of said structure to bring about separation of the substrate and superstrate due to the presence of said micro-bubbles or micro-cavities to obtain a silicon wafer constituted by the substrate and/or a silicon wafer constituted by the superstrate.

In accordance with an embodiment, the method may include producing projecting portions in the substrate and/or the superstrate on said intermediate layer side.

In accordance with an embodiment, the projecting portions are preferably rectilinear and extend to the sides of the structure.

In accordance with an embodiment, at least some of said micro-bubbles or micro-cavities are preferably open-celled and at least some thereof constitute channels.

Embodiments also pertain to an application of the method to the fabrication of silicon on insulator (S.O.I.) plates for the fabrication of integrated electronic circuits and/or integrated opto-electronic circuits.

Embodiments also pertain to a structure in the form of a plate including at least one substrate, a superstrate and at least one intermediate layer interposed between the substrate and the superstrate.

In an embodiment, said intermediate layer includes at least one base material having distributed therein atoms or molecules termed extrinsic atoms or molecules which differ from the atoms or molecules of the base material so that, under the effect of a heat treatment, the intermediate layer becomes plastically deformable and the presence of the selected extrinsic atoms or molecules in the selected base material causes the irreversible formation of micro-bubbles or micro-cavities in the intermediate layer.

In an embodiment, the substrate and the superstrate are preferably formed from monocrystalline silicon and the intermediate layer is formed from doped silica.

In an embodiment, the base material is preferably silica and the extrinsic atoms are preferably atoms of phosphorus or boron, thus forming an intermediate layer of phospho-silicate glass (P.S.G.), boro-silicate glass (B.S.G.), or boro-phospho-silicate glass (B.P.S.G.).

In an embodiment, the concentration of phosphorus is preferably in the range from 8% to 14%.

In an embodiment, the concentration of boron is preferably in the range from 0% to 4%.

In an embodiment, the substrate and/or the superstrate preferably have portions projecting into said intermediate layer.

In an embodiment, the projecting portions are preferably rectilinear and extend to the sides.

In an embodiment, at least some of said micro-bubbles or micro-cavities are open-celled and at least some thereof constitute channels.

BRIEF DESCRIPTION OF THE DRAWINGS

The present invention will be better understood from a study of structures and a mode of fabrication of such structures, described with reference to non-limiting examples shown in the accompanying drawings in which.

While the invention is susceptible to various modifications and alternative forms, specific embodiments thereof are shown by way of example in the drawings and will herein be described in detail. It should be understood, however, that the drawing and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 1:
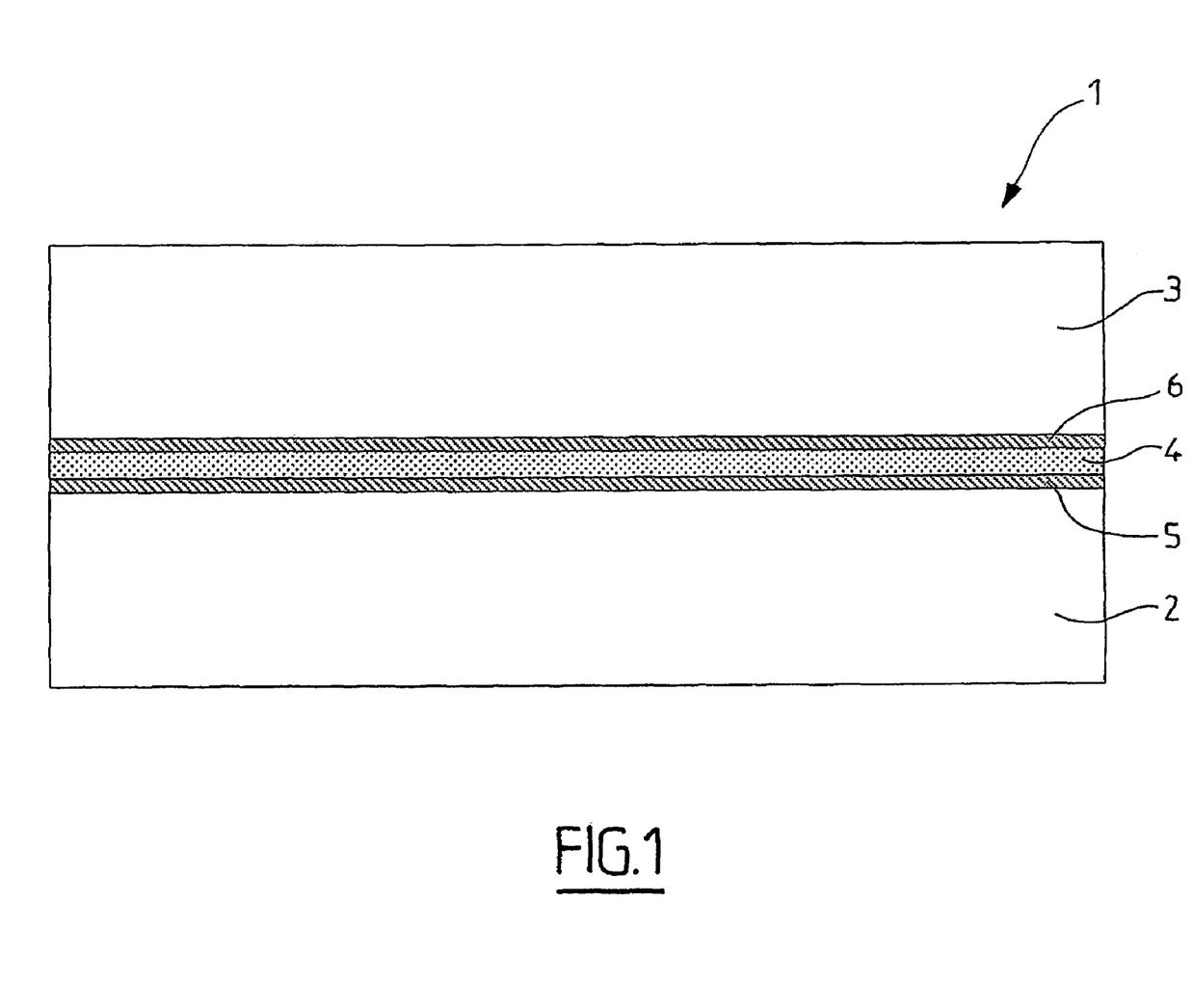
FIG. 1 shows a cross section of an embodiment of a structure, in an initial state.

FIG. 1 shows a structure 1 in the form of a plate which, for example, has a diameter of about two hundred millimeters.

This structure includes a substrate 2 in the form of a wafer, a superstrate 3 in the form of a wafer and an intermediate layer 4 interposed between the substrate 2 and the superstrate 3.

In general, the intermediate layer 4 is formed from at least one base material having distributed therein atoms or molecules termed extrinsic atoms or molecules which differ from the atoms or molecules of the base material, and has a composition such that, when a suitable heat treatment is applied to the structure 1, micro-bubbles or micro-cavities, in particular of a gaseous phase, are irreversibly formed such that said intermediate layer 4 transforms to become spongy and, as a correlation, it is likely to increase in thickness.

Figure 2:
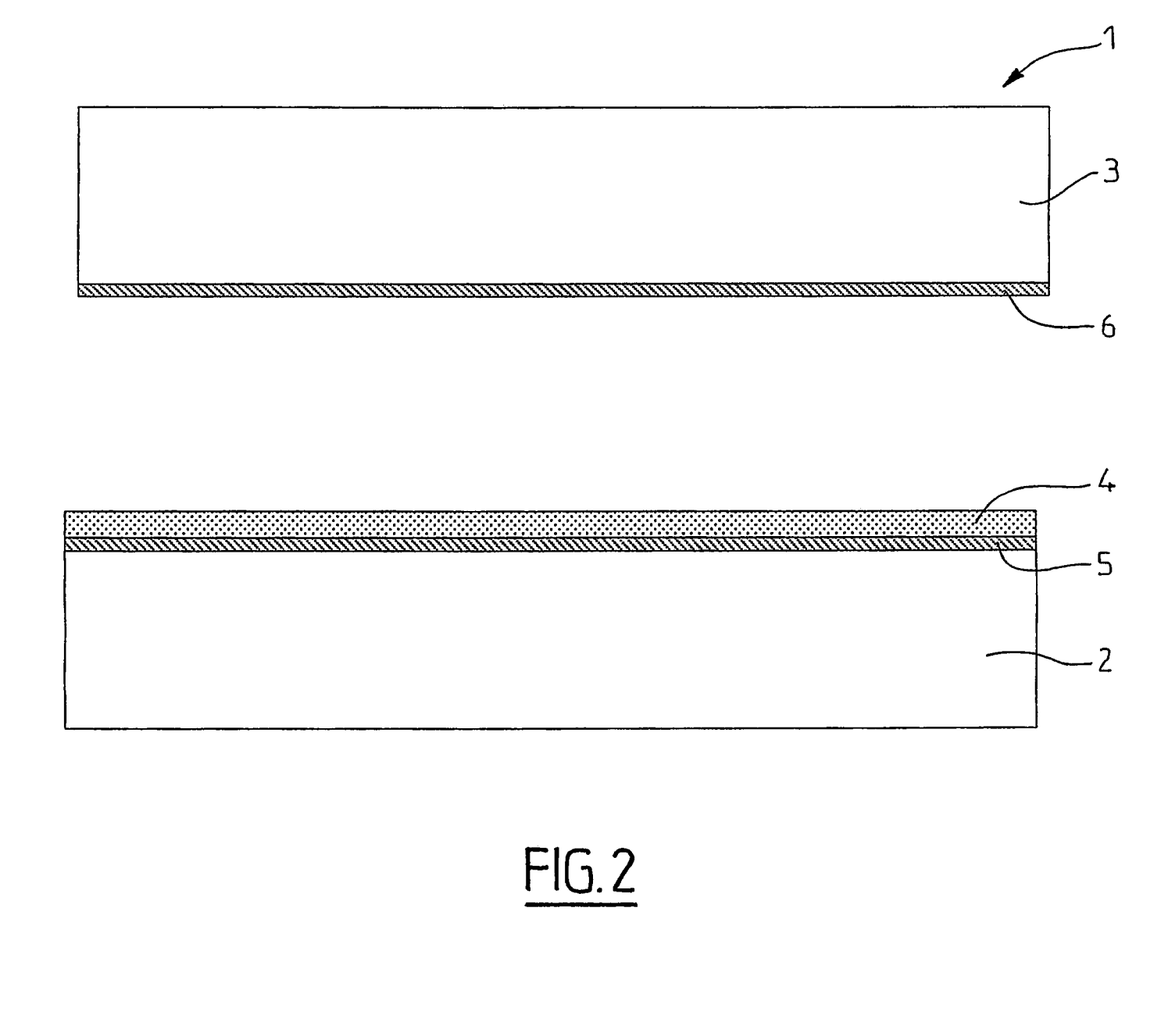
FIG. 2 shows an exploded cross section of the structure of FIG. 1 during fabrication.

An example of an embodiment of a structure 1 will now be described with reference to FIG. 2.

The substrate 2 may be constituted by a monocrystalline silicon wafer which may be several hundred microns thick, for example in the range from five hundred to a thousand microns.

Optionally but preferably, a film 5 of thermal silicon oxide is then produced on one face of the substrate 2.

This film 5 may be produced in an oxidation furnace, at a temperature in the range from 950° C. to 1100° C., and may have a thickness of about 0.5 micron.

Next, a layer of silicon containing or doped with a high percentage of phosphorus and/or boron is deposited on the oxidized face 5 of superstrate 2 to obtain the intermediate layer 4 composed of a material of the phospho-silicate glass (PSG), boro-silicate glass (B.S.G.), or boro-phospho-silicate glass (BPSG) type.

As an example, the percentage of phosphorus in the material constituting the intermediate layer 4 may be in the range from 6 to 14. Such a deposit may be produced using known techniques in deposition machines of the CVD, LPCVD or PECVD type.

The thickness of the intermediate layer 4 so constituted may be in the region of five microns.

Optionally but preferably, the surface of the intermediate layer 4 may undergo a chemical cleaning treatment, for example an RCA type chemical cleaning, which is known per se.

Optionally but preferably, before or after the cleaning treatment, a chemical-mechanical polishing (CMP) operation may be carried out on the intermediate layer 4.

In the same manner, the superstrate 3 may be constituted by a silicon wafer optionally having a film 6 of thermal silicon oxide and which has optionally undergone an RCA chemical cleaning treatment and optionally a chemical-mechanical polishing operation (CMP).

In a corresponding manner, the intermediate layer 4 may have been produced on the oxidized face 6 of the superstrate 3.

Thereafter, the substrate 2 and the superstrate 3 are assembled by placing the oxidized face 6 of the superstrate 3 in contact on the intermediate layer 4 to obtain molecular wafer bonding, optionally facilitated by the application of force, preferably point bearing forces, between the substrate 2 and the superstrate 3.

In order optionally to increase the interfacial bonding energy, a consolidating heat treatment may be applied to the assembled structure 1 employing conditions which do not cause transformation of the intermediate layer 4, i.e. the formation of micro-bubbles or micro-cavities, as will be described below.

A structure 1 is thus obtained, composed of a substrate 2 formed from silicon and a superstrate 3 formed from silicon separated by an intermediate layer 4 formed from an electrically insulating material.

Figure 3:
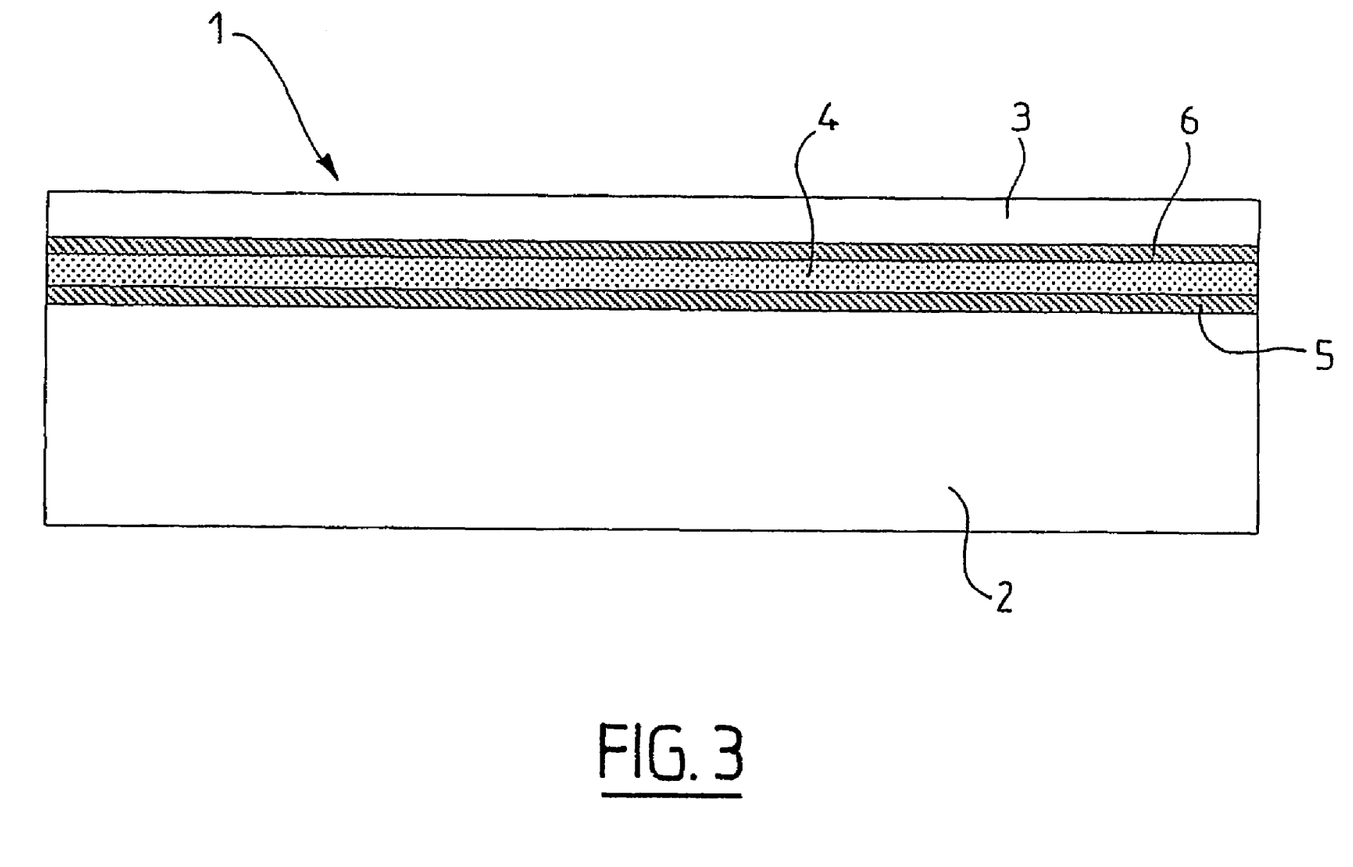
FIG. 3 shows a section of the structure of FIG. 1, in a subsequent fabrication step.

Referring to FIG. 3, it can be seen that the thickness of the superstrate 3 may be much smaller than the thickness of the substrate 2 and may be in the range from a fraction of a micron to several tens of microns.

Such a thin substrate 3 may initially be used to produce the structure 1 as described with reference to FIG. 2.

However, in a variation, such a thin superstrate 3 may be obtained by reducing the thickness of a thick superstrate 3 initially employed to produce the structure 1 as described with reference to FIG. 2. Such a reduction in thickness may be brought about using known grinding, chemical attack or chemical-mechanical polishing techniques and may also be obtained by a cleavage technique, for example SMART-CUT, a known commercial method necessitating the ionic implantation of protons in a dose of the order of 5E16 Cm-2 into the superstrate 3 prior to carrying out molecular wafer bonding as discussed above.

An operation for reducing the thickness of the substrate 2 could also be carried out.

Figure 4:
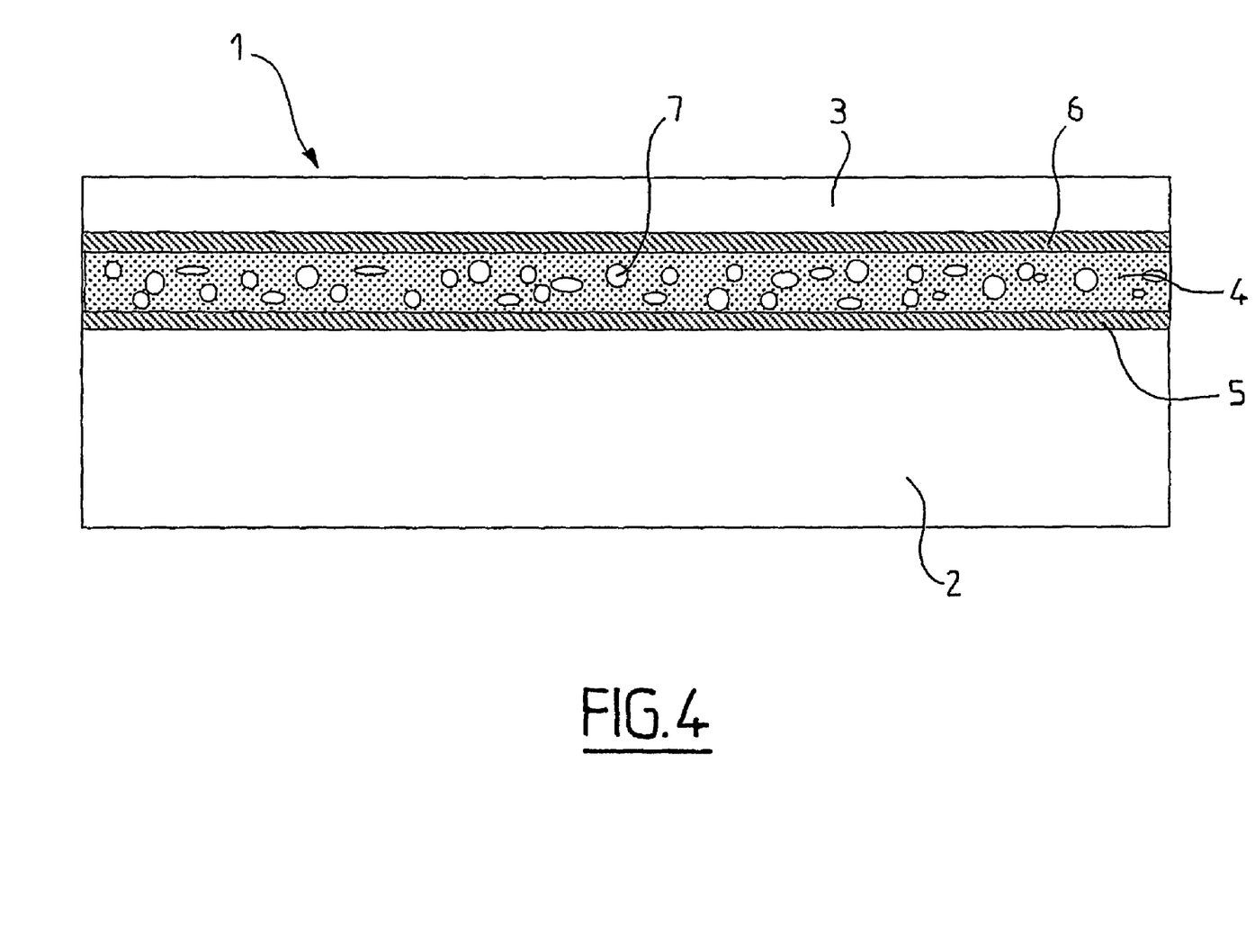
FIGS. 4 and 5 show a section of the structure of FIG. 1 in a secondary state of fabrication.

As can be seen in FIG. 4, the structure 1 may then undergo a heat treatment carried out in a furnace, for example at a temperature in the range from 900° C. to 1100° C.

Regarding the selected materials mentioned above, applying such a heat treatment in the selected temperature range renders the intermediate layer 4 plastically deformable and causes the irreversible formation of a gas phase constituted by micro-bubbles or micro-cavities 7 in the intermediate layer and, as a correlation, an increase in the thickness of said layer 4.

The quantity and volume of the micro-bubbles or micro-cavities 7 depend on the composition of the intermediate layer 4 and the conditions of the heat treatment applied to the structure 1.

As an example, starting from five microns, after treatment, the intermediate layer may have a thickness in the range from fifteen to twenty microns.

Figure 5:
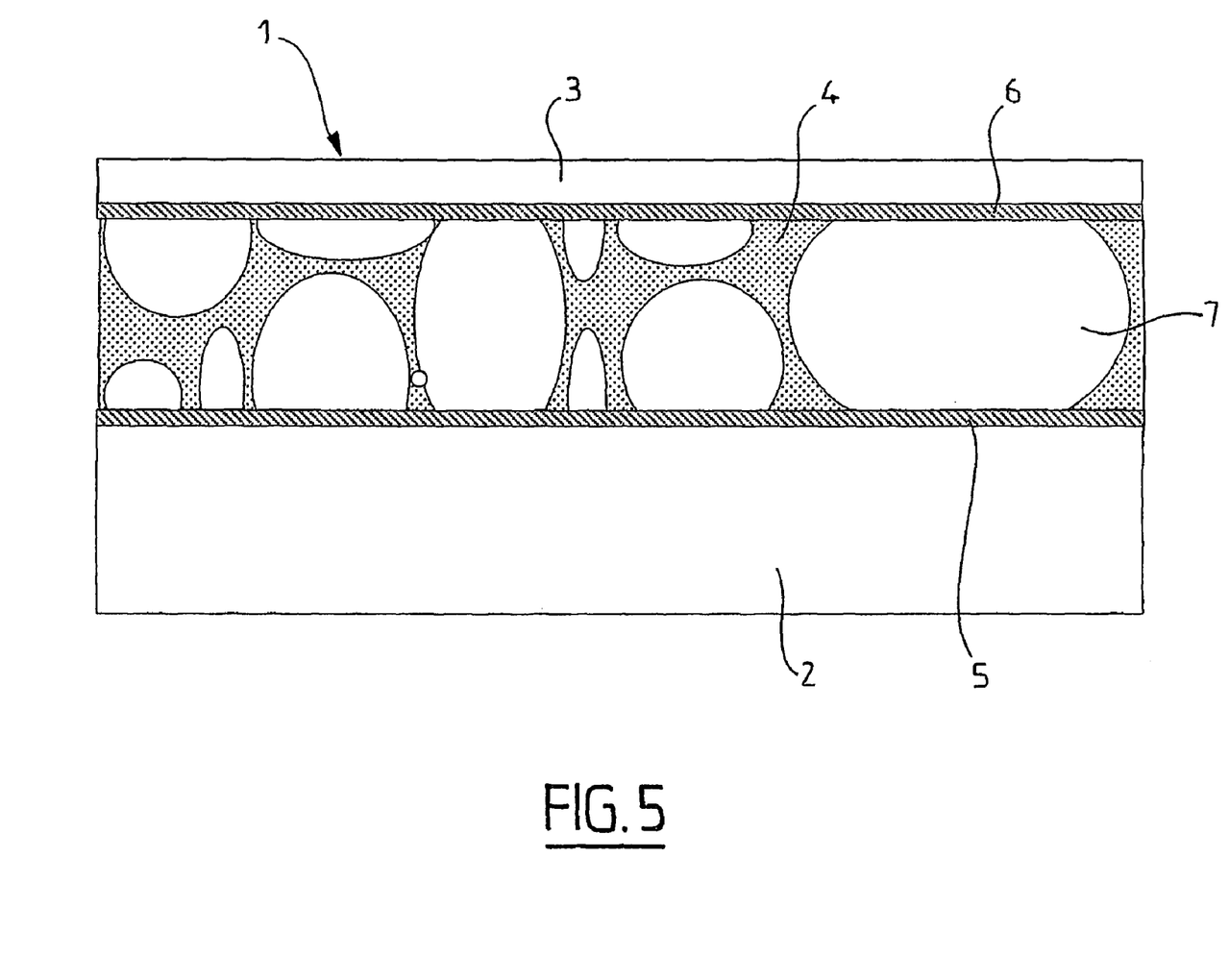

As can be seen in FIG. 5, the micro-bubbles or micro-cavities 7 may be of a volume such that they are open on the substrate 2 and/or superstrate 3 face side and furthermore, they may be mutually open to constitute channels which are open to the side ends of the intermediate layer 4.

Figure 6:
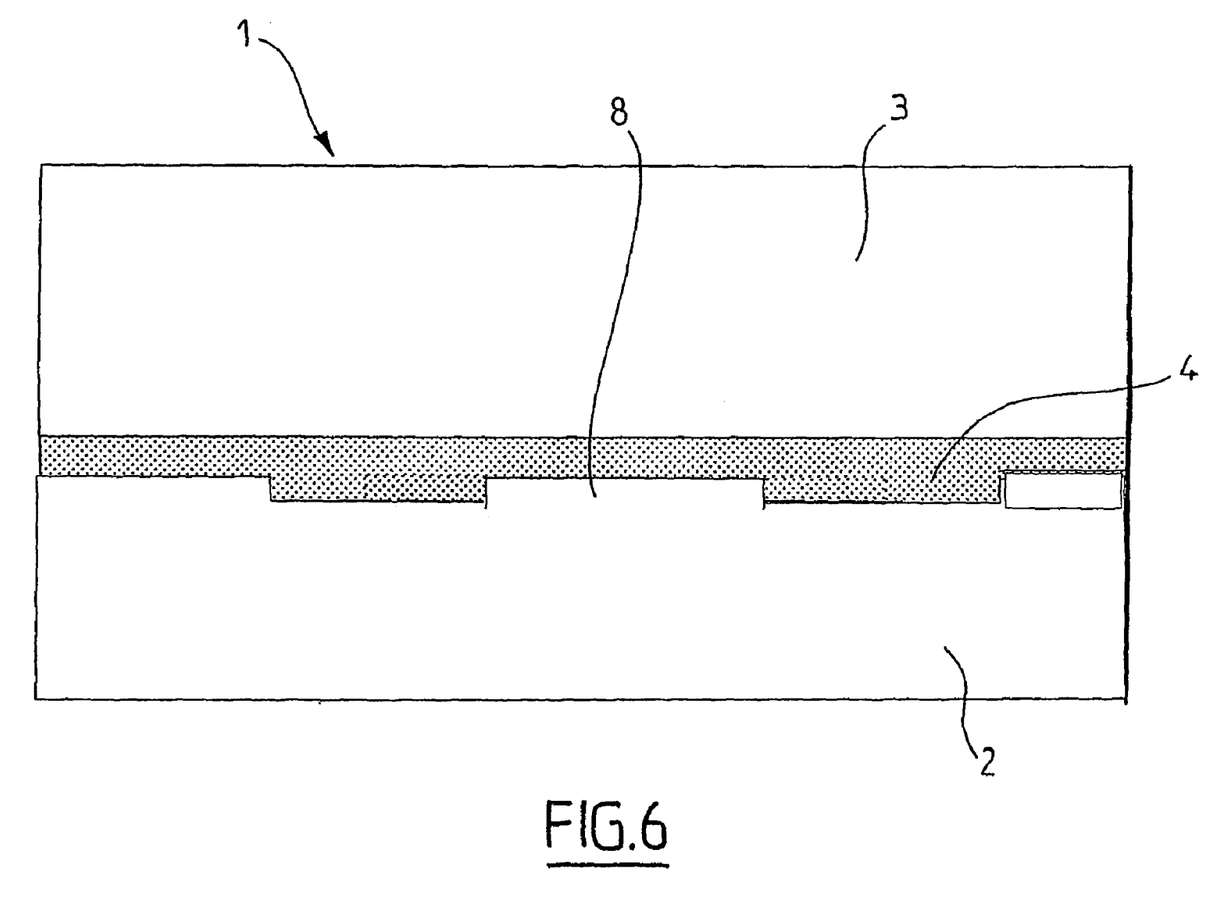
FIG. 6 shows a variation of the structure of FIG. 1.

As can be seen in FIG. 6, it may be particularly advantageous to produce projecting portions 8, which are preferably rectilinear, in the substrate 2 and/or in the superstrate 3, for example by etching, so that said projecting portions 8 constitute rectangular notches. This disposition may facilitate the appearance of micro-bubbles or micro-cavities 7, one running into another to constitute channels.

The structure 1 just described, containing micro-bubbles or micro-cavities 7 in its intermediate layer 4, may have many applications.

It may be used as is for the production of electronic or opto-electronic integrated circuits on the silicon superstrate 3, mounted on a thick substrate 2 via the intermediate layer 4 which constitutes an electrical insulator, the capacitance between the superficial layer constituted by the superstrate 3 and the support layer constituted by the substrate 2 being particularly low because of the presence of micro-bubbles or micro-cavities 7.

In a further application example, the channels which are optionally but intentionally created in the intermediate layer 4 by the micro-bubbles or micro-cavities 7 may be used to circulate a cooling fluid between the substrate 2 and the superstrate 3 with the aim of cooling the structure 1.

In a further particularly advantageous application, the structure 1 containing micro-bubbles or micro-cavities 7 constitutes a releasable structure because the presence of the micro-bubbles or micro-cavities 7 in the intermediate layer 4 weakens the physical or chemical strength of this layer.

By applying forces between the substrate 2 and the superstrate 3 using any known means and, for example, by inserting a fine blade between the substrate 2 and the superstrate 3 or a jet of water under very high pressure, the intermediate layer 4 may be caused to rupture and thereby cause separation of the substrate 2, which then constitutes a wafer, and superstrate 3, which then constitutes a wafer, by rupture of the material of the intermediate layer 3 between the micro-bubbles or micro-cavities 7.

It is also possible to carry out a chemical attack of the intermediate layer 4 from its sides, for example using a solution of hydrofluoric acids, which can readily progress between the substrate 2 and the superstrate 3 due to the presence of micro-bubbles or micro-cavities 7.

Thus, starting from the structure 1 described with reference to FIG. 3, a thin silicon wafer constituted by the thin superstrate 3 is produced.

The thin silicon wafer 3 obtained may be fixed by one or the other of its faces to any final operating support formed from plastic, for example, to produce flexible electronic and/or opto-electronic circuits.

The present invention is not limited to the examples described above. Variations in the implementations are possible without departing from the scope of the invention defined in the accompanying claims.

What is claimed is:

1. A method for fabricating a silicon wafer, which method comprises:
    depositing at least one intermediate layer on either of a substrate and/or a superstrate by chemical vapor deposition, wherein the intermediate layer is deposited as a glass comprising at least one base material having distributed therein extrinsic atoms or molecules which differ from those of the base material;
    assembling the substrate and the superstrate so that the as-deposited intermediate layer is interposed between the substrate and the superstrate to form a silicon wafer structure; and
    applying a heat treatment to the resulting structure in a temperature range that causes the intermediate layer to become spongy and plastically deformable with the as-deposited extrinsic atoms or molecules in the base material causing an irreversible formation of microbubbles or microcavities in the intermediate layer resulting from the heat treatment in a configuration and amount which weakens the intermediate layer.

2. The method as claimed in claim 1, which further comprises continuing the heat treatment until it produces a rupture of the intermediate layer and, as a result, separation of the substrate and the superstrate.

3. The method as claimed in claim 1, which further comprises applying forces between the substrate and the superstrate to bring about the rupture of the intermediate layer between the substrate and the superstrate due to the presence of the microbubbles or microcavities.

4. The method as claimed in claim 1, which further comprises chemically attacking the intermediate layer of the structure so as to separate the substrate and the superstrate.

5. The method as claimed in claim 1, wherein the intermediate layer increases in its thickness subsequent to the heat treatment as compared to its thickness prior to the heat treatment by as much as a factor of 3.

6. The method as claimed in claim 1, wherein after the heat treatment, at least some of the microbubbles or microcavities have a volume such that they are open both on the substrate and on the superstrate side, or furthermore that they are mutually open to constitute channels which are open between the side ends of the intermediate layer.

7. The method as claimed in claim 6, which further comprises providing projecting portions in the substrate or superstrate which constitute notches that facilitate the formation of the channels.

8. The method as claimed in claim 6, which further comprises cooling the structure by circulating a cooling fluid through the channels formed by the microbubbles or microcavities.

9. The method as claimed in claim 6, which further comprises introducing a solution of acid into the channels to chemically attack the intermediate layer.

10. The method as claimed in claim 1, which further comprises reducing the thickness of the superstrate or substrate.

11. The method as claimed in claim 1, wherein the substrate and the superstrate are formed from monocrystalline silicon.

12. The method as claimed in claim 1, wherein the base material comprises silica and the extrinsic atoms comprise atoms of phosphorus, thus forming an intermediate layer of phospho-silicate glass.

13. The method as claimed in claim 12, wherein the extrinsic atoms further comprise atoms of boron, thus forming an intermediate layer of boro-phospho-silicate glass.

14. The method as claimed in claim 13, wherein the concentration of phosphorus is in the range from 6% to 14%.

15. The method as claimed in claim 13, wherein the concentration of boron is in the range from 0% to 4%.

16. The method as claimed in claim 1, wherein the heat treatment is carried out at a temperature in the range from 900° C. to 1200° C.

17. The method as claimed in claim 1, wherein the step of assembling further comprises attaching the superstrate or substrate to the intermediate layer by molecular wafer bonding.

18. The method as claimed in claim 17, which further comprises, prior to the step of assembling, providing a thermal silicon oxide on either of the substrate or superstrate that does not include the intermediate layer.

19. The method as claimed in claim 17, which further comprises, prior to the step of depositing, providing a thermal silicon oxide on each of the substrate and superstrate so that the intermediate layer is deposited on the thermal silicon oxide on either of the substrate or the superstrate.

20. The method as claimed in claim 1, which further comprises fabricating the plate as a silicon on insulator plate for the further fabrication of integrated electronic circuits or integrated opto-electronic circuits thereon.

* * * * *